US009566612B2

(12) United States Patent
Shibamoto

(10) Patent No.: US 9,566,612 B2
(45) Date of Patent: Feb. 14, 2017

(54) ULTRASONIC PROBE

(75) Inventor: Koichi Shibamoto, Nasushiobara (JP)

(73) Assignee: Toshiba Medical Systems Corporation, Otawara-shi (JP)

( * ) Notice: Subject to any disclaimer, the term of this patent is extended or adjusted under 35 U.S.C. 154(b) by 847 days.

(21) Appl. No.: 13/885,897

(22) PCT Filed: May 31, 2012

(86) PCT No.: PCT/JP2012/064144
§ 371 (c)(1),
(2), (4) Date: May 16, 2013

(87) PCT Pub. No.: WO2012/165573
PCT Pub. Date: Dec. 6, 2012

(65) Prior Publication Data

US 2013/0241350 A1 Sep. 19, 2013

(30) Foreign Application Priority Data

Jun. 2, 2011 (JP) ................................ 2011-123922

(51) Int. Cl.
*H01L 41/08* (2006.01)
*H02N 2/00* (2006.01)
(Continued)

(52) U.S. Cl.
CPC ............... *B06B 1/06* (2013.01); *G10K 11/002* (2013.01)

(58) Field of Classification Search
CPC ............ G10K 11/02; B06B 1/06; A61B 8/00; G10N 29/24
(Continued)

(56) References Cited

U.S. PATENT DOCUMENTS 5,212,671 A 5/1993 Fujii et al.
5,371,717 A 12/1994 Bolorforosh
(Continued)

FOREIGN PATENT DOCUMENTS

CN 1712443 A 12/2005
EP 0629992 A * 12/1994 ............ G10K 11/02
(Continued)

OTHER PUBLICATIONS

Combined Chinese Office Action and Search Report issued Jul. 30, 2014 in Patent Application No. 201280004054.4 (with English translation of categories of cited documents).
(Continued)

*Primary Examiner* — Thomas Dougherty
(74) *Attorney, Agent, or Firm* — Oblon, McClelland, Maier & Neustadt, L.L.P.

(57) ABSTRACT

An ultrasonic probe including a piezoelectric vibrator and a layer, wherein the piezoelectric vibrator transmits and receives ultrasonic waves. The layer is connected to a rear surface of a side opposite a side receiving and sending ultrasonic waves from the piezoelectric vibrator and has an acoustic impedance and Young's modulus larger than that of the piezoelectric vibrator, and includes a plurality of grooves arranged such that the rear surface of the piezoelectric vibrator faces the grooves opening, wherein the plurality of grooves are shaped such that groove capacity occupying the layer volume is increased in a direction along a center to an end of the rear surface of the piezoelectric vibrator.

15 Claims, 8 Drawing Sheets

(51) Int. Cl.
*B06B 1/06* (2006.01)
*G10K 11/00* (2006.01)

(58) Field of Classification Search
USPC .................................................. 310/322, 334
See application file for complete search history.

(56) References Cited

U.S. PATENT DOCUMENTS

| | | | | |
|---|---|---|---|---|
| 5,882,309 | A | 3/1999 | Chiao et al. | |
| 7,348,712 | B2 * | 3/2008 | Ogawa | B06B 1/0629 310/334 |
| 2004/0048470 | A1 * | 3/2004 | Dinet | B06B 1/0629 438/689 |
| 2008/0125658 | A1 | 5/2008 | Lee et al. | |
| 2008/0238259 | A1 * | 10/2008 | Osawa | B06B 1/0611 310/334 |
| 2013/0147318 | A1 * | 6/2013 | Kim | H01L 41/09 310/335 |
| 2013/0181577 | A1 * | 7/2013 | Min | A61B 8/4483 310/336 |

FOREIGN PATENT DOCUMENTS

| | | | | |
|---|---|---|---|---|
| JP | EP-0342874 | A2 * | 5/1988 | B06B 1/06 |
| JP | 3 151948 | | 6/1991 | |
| JP | 04128765 | A * | 8/1992 | G10N 29/24 |
| JP | 7 30999 | | 1/1995 | |
| JP | 11 70111 | | 3/1999 | |
| JP | 2000-271116 | A | 10/2000 | |
| JP | 2002-354589 | A | 12/2002 | |
| JP | 2005-286701 | A | 10/2005 | |
| JP | 2005-324008 | A | 11/2005 | |
| JP | 2005-324008 | A * | 11/2005 | A61B 8/00 |
| JP | 2005 328507 | | 11/2005 | |
| JP | 2006 313977 | | 11/2006 | |
| JP | 2009-82612 | A | 4/2009 | |
| JP | 2010 502297 | | 1/2010 | |
| JP | 2013-144111 | A * | 7/2013 | A61B 8/00 |

OTHER PUBLICATIONS

Office Action issued Jan. 27, 2015 in Japanese Patent Application No. 2011-123922.

International Search Report issued Aug. 28, 2012 in PCT/JP11/064144 filed May 31, 2012.

* cited by examiner

ULTRASONIC PROBE

FIELD OF THE INVENTION

The embodiment of the present invention relates to an ultrasonic probe.

BACKGROUND OF THE INVENTION

Ultrasonic diagnostic equipment exists that scans the inside of a subject with ultrasonic waves and images the internal state of the subject based on received signals, which are reflected waves from inside the subject. Ultrasonic diagnostic equipment such as this transmits ultrasonic waves from an ultrasonic probe to inside the subject, receives reflected waves generated from the non-conformance of acoustic impedance inside the subject, and generates received signals. Furthermore, the direction orthogonally intersecting the ultrasonic wave-transmitting and receiving direction may be referred to as the lens direction (the direction in which the ultrasonic waves are diffused or converged, i.e., in which the lens effect occurs), slice direction, or elevation direction. Moreover, the direction orthogonally intersecting the ultrasonic wave-transmitting and receiving direction as well as the lens direction may be referred to as the array direction.

The ultrasonic probe comprises a piezoelectric vibrator that generates ultrasonic waves by oscillating based on the transmitted signals and generates received signals by receiving the reflected waves. The piezoelectric vibrator in which a plurality of elements is arranged in the array direction is referred to as a one-dimensional array ultrasound transducer.

With the purpose of reducing the side lobe of an acoustic field in the lens direction of the one-dimensional array ultrasound transducer and uniform acoustic field, one technique involves weighting the transmitted sound pressure strength and the receiver sensitivity with respect to a piezoelectric vibrator 3. The technique of weighting may be referred to as a weighting technique.

SUMMARY OF THE INVENTION

Problem to be Solved by the Invention

However, as an example of this weighting technique, when grooves are shaped in the piezoelectric vibrator that is brittle such as those of ceramic, etc., which does not have sufficient strength, the reliability of the piezo-electric device 3 declines, including damage to the piezoelectric vibrator. Furthermore, there are problems of increased costs due to restrictions on the workability of the piezoelectric vibrator along with restricted grooving, making sufficient and ideal weighting difficult.

This embodiment solves the problems mentioned above, with the purpose of providing an ultrasonic probe weighted with low cost and high reliability.

Means of Solving the Problem

In order to solve the problems mentioned above, the ultrasonic probe of the embodiment comprises a piezoelectric vibrator and a layer, wherein, the piezoelectric vibrator transmits and receives ultrasonic waves. This layer is connected to the rear surface of the side opposite to the side receiving and sending ultrasonic waves and comprises a larger acoustic impedance than the piezoelectric vibrator along with a plurality of grooves arranged such that the rear surface of the piezoelectric vibrator faces the grooves opening, wherein, the plurality of grooves are shaped such that the percentage of the groove capacity to the layer volume is increased in a direction along the center to the end of the rear surface of the piezoelectric vibrator.

DESCRIPTION OF THE PREFERRED EMBODIMENT

Next, the ultrasonic probe related to the embodiment is described with reference to each diagram.

The ultrasonic probe comprises a piezoelectric vibrator 3 and a middle layer 8 with larger acoustic impedance than the piezoelectric vibrator, thereby, allowing a configuration to be obtained with a piezoelectric vibrator 3 thickness ¼the wavelength λ of the ultrasonic waves (hereinafter, referred to as a λ/4 oscillatory structure). Furthermore, the middle layer 8 may also be referred to as a Hardback). By having the λ/4 oscillatory structure, the effects of the ultrasonic waves reflected from the middle layer 8 on the piezoelectric vibrator 3 may be suppressed.

In the λ/4 oscillatory structure, by means of carrying out grooving in the middle layer 8 with higher strength and good workability, the transmitting and receiving sensitivity are weighted. Specifically, the following configurations may be considered. Here, the rear surface of the middle layer 8 refers to the surface opposite to the surface of the piezoelectric vibrator 3 side of the middle layer 8.

The disclosure describes examples in which the grooves are formed at different depths as follows. Note that the grooves 9 become deeper in the order of (1), (2), and (3) described below. (1) Grooves 9 are shaped with a depth from the surface of the piezoelectric vibrator 3 side to mid-way of the middle layer 8 thickness (refer to FIG. 1). This is described in the first embodiment.

Figure 4:
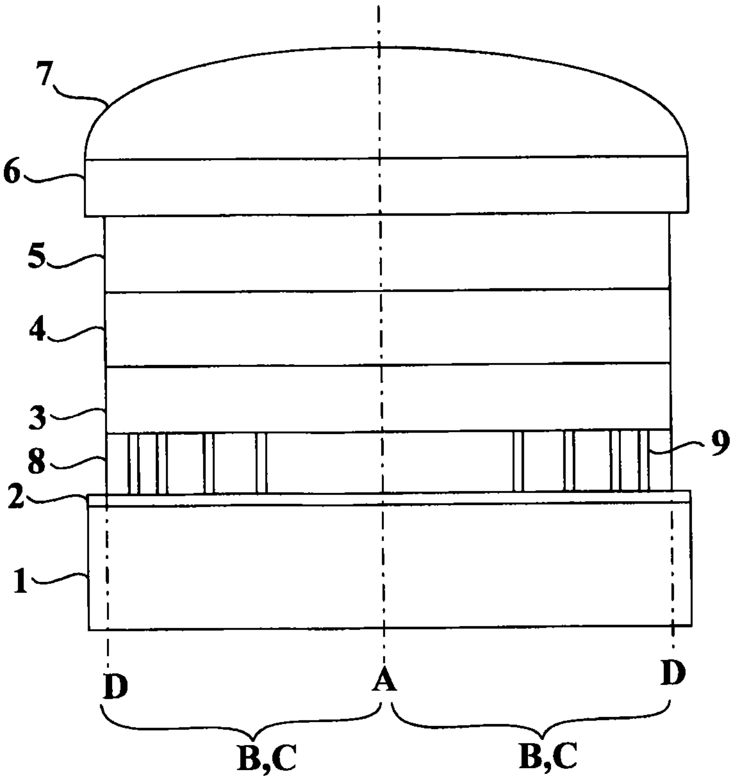
FIG. 4 is a cross-sectional diagram with the ultrasonic probe related to Embodiment 2 cut in the lens direction.

(2) Grooves 9 are shaped with a depth from the rear surface of the middle layer 8 to the end surface of the piezoelectric vibrator 3 side (refer to FIG. 4). This is described in the second embodiment.

Figure 5:
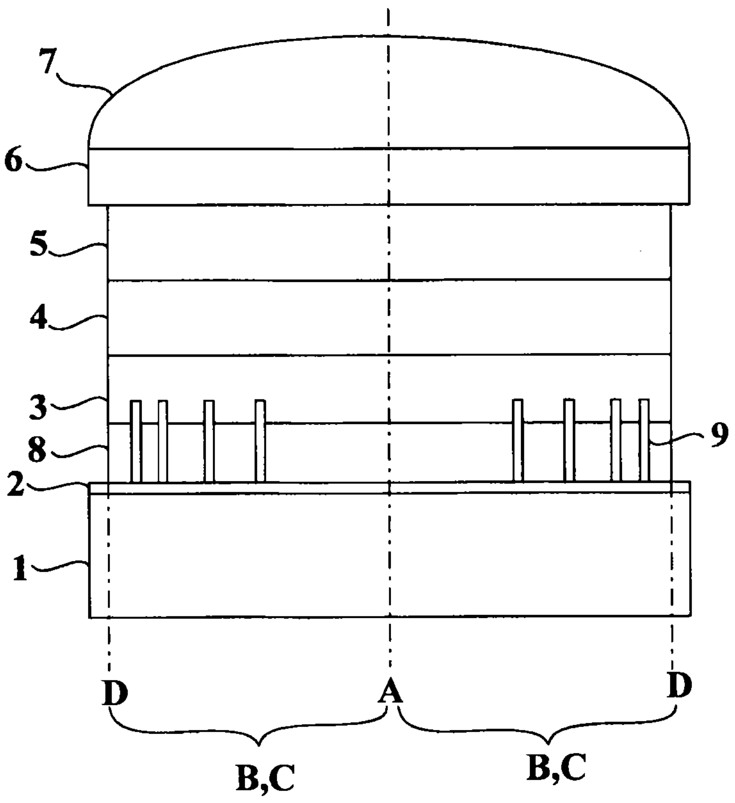
FIG. 5 is a cross-sectional diagram with the ultrasonic probe related to Embodiment 3 cut in the lens direction.

(3) Grooves 9 are shaped with a depth from the rear surface of the middle layer 8 to mid-way of the piezoelectric vibrator 3 thickness (refer to FIG. 5). This example indicates that, if the middle layer 8 has grooves, the piezoelectric vibrator need not necessarily be provided with the grooves (above (1) and (2) correspond to this example), and that, even if grooves are formed, shallow grooves will suffice. FIG. 5 illustrates grooves in the middle layer 8. The depth of the grooves from the boundary between the piezoelectric vibrator 3 and the middle layer 8 is shallower than the grooves 9 in the piezoelectric vibrator 3 illustrated as a comparative example in FIG. 7. As described below, FIG. 5 illustrates an example in which the grooves require less processing as compared to those of FIG. 7 according to the depth. This is described in the third embodiment.

The configuration of each embodiment is described in the following. Furthermore, the acoustic simulation outcome by finite element analysis is also described.

Embodiment 1

Next, the configuration and manufacturing method of the ultrasonic probe related to Embodiment 1 is described with reference to FIG. 1, FIG. 2, and FIG. 3.

Figure 1:
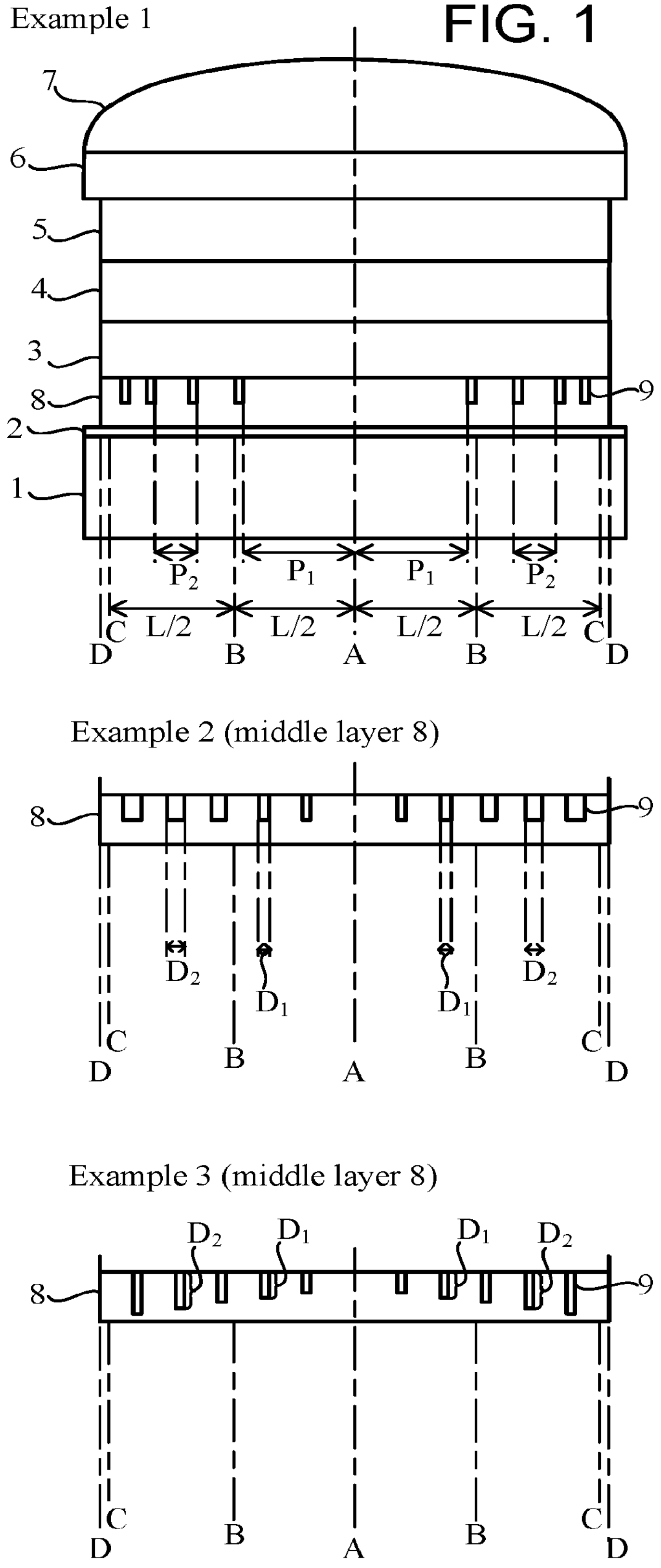
FIG. 1 is a cross-sectional diagram with the ultrasonic probe related to Embodiment 1 cut in the lens direction.
Figure 2:
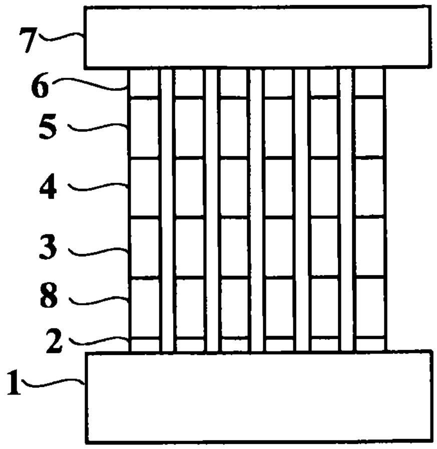
FIG. 2 is a cross-sectional diagram with the ultrasonic probe cut in the array direction.

FIG. 1 is a cross-sectional diagram with the ultrasonic probe cut in the lens direction, while FIG. 2 is a cross-sectional diagram with the ultrasonic probe cut in the array direction. Furthermore, a one-dimensional sector array probe is described as a representational example of the ultrasonic probe.

As shown in FIG. 1 and FIG. 2, the ultrasonic probe comprises a rear surface material 1, a substrate for signal withdrawal 2, the piezoelectric vibrator 3, an acoustic matching layer, an acoustic lens 7, and the middle layer 8. Furthermore, the substrate for signal withdrawal 2 may be referred to as a FPC (Flexible Print Circuit).

A plurality of piezoelectric vibrators 3 are provided on a known rear material (not illustrated), a known acoustic matching layer is provided on the piezoelectric vibrator 3, and furthermore, a known acoustic lens 7 is provided on the acoustic matching layer via the FPC (not illustrated). That is, these are layered in the order of the rear material 1, piezoelectric vibrator 3, acoustic matching layer, FPC, and acoustic lens 7. In the piezoelectric vibrator 3, the surface provided with the acoustic matching layer becomes the radiation plane side of the ultrasonic waves, while the opposite surface of the surface (the surface provided with the rear material 1) becomes the rear surface side. A common (GND) electrode is provided on the radiation plane side, while a signal electrode is connected on the rear surface side. The rear surface side of the piezoelectric vibrator 3 is provided with the middle layer 8, an FPC2 is provided below the middle layer 8, and furthermore, the rear material 1 is provided below the FPC2. Furthermore, details on the middle layer 8 are mentioned later.

Acoustic/electric reversible conversion elements, etc., such as a piezoelectric ceramic, etc. may be used as the piezoelectric vibrator 3. For example, ceramic materials such as lead zirconate titanate Pb (Zr, Ti) $O_3$, lithium niobate ($LiNbO_3$), barium titanate ($BaTiO_3$), lead titanate ($PbTiO_3$), etc. are preferably used.

The acoustic matching layer is provided for better acoustic matching between the acoustic impedance of the ultrasound transducer and the acoustic impedance of the subject. The acoustic matching layer may be comprised of 1 or 2 layers, possibly comprising 3 or more layers, with a first acoustic matching layer 4, a second acoustic matching layer 5, and a third acoustic matching layer 6, as in the present embodiment.

The rear material 1 prevents ultrasonic communication from the ultrasound transducer from the front to the rear. Moreover, among ultrasonic vibrations oscillated from the piezoelectric vibrator 3 and ultrasonic vibrations as they receive, the rear material 1 dampingly absorbs vibrational components for ultrasonic wave vibration not necessary for image extraction of the ultrasonic diagnostic equipment (not illustrated). Generally, materials with inorganic particle powders such as tungsten, ferrite, zinc oxide etc. mixed into synthetic rubber, epoxy resin, or polyurethane rubber, etc. are used as the rear material 1.

[Middle layer]

Next, the middle layer 8 is described with reference to FIG. 1 and FIG. 2.

As shown in FIG. 1 and FIG. 2, the middle layer 8 is arranged between the rear surface of the piezoelectric vibrator 3 and the FPC2.

A material with larger acoustic impedance than the piezoelectric vibrator 3 (approximately 30 Mrayl) and larger Young's modulus than the piezoelectric vibrator 3 (approximately 50 GPa), that is, a harder material, is used for the middle layer 8.

Examples of materials used for the middle layer 8 use gold, lead, tungsten, sapphire, cemented carbide alloy, etc. By means of shaping the middle layer 8 using these materials, shaping the groove 9 in the middle layer 8 may be simplified.

The middle layer 8 is provided with a member having conductivity. Examples of materials that have conductivity use gold, lead, tungsten, cemented carbide alloy, etc. By means of using materials having conductivity, an undersurface electrode of the piezoelectric vibrator 3 and the FPC2 may be connected via the middle layer 8.

(Groove)

The plurality of grooves 9 for weighting is provided on the middle layer 8. The plurality of grooves 9 are arranged such that the rear surface of the piezoelectric vibrator 3 faces the groove opening. The plurality of grooves 9 are shaped such that the percentage of the groove 9 capacity to the middle layer 8 volume is increased away from the center (lens direction, slice direction) of the rear surface of the piezoelectric vibrator 3.

Here, the lens directional location in the middle layer 8 corresponding to the center of the rear surface of the piezoelectric vibrator 3 is determined as A (see FIG. 1), and the lens directional location of the middle layer 8 corresponding to the lens directional end of the rear surface of the piezoelectric vibrator 3 is determined as D. Moreover, in the location from the location A to the location D, any distance L from the location A is determined as C, and the location half the distance thereof L/2 is determined as B. Furthermore, the total value of all the grooves in the middle layer 8 between A-B (distance L/2) is determined as V1, and the total volume of all the grooves in the middle layer 8 between B-C (distance L/2) is determined as V2. At this time, the plurality of grooves 9 are shaped such that the volume V2 of the grooves 9 between B-C is greater than the volume V1 of the grooves 9 between A-B (V1<V2).

The plurality of grooves 9 are shaped based on any of the following embodiments. Here, the middle layer 8 comprises a fixed thickness.

EXAMPLE 1

The plurality of grooves 9 are shaped such that the spacing, which is the distance between the proximate grooves 9, becomes narrower from the center to the lens directional end of the middle layer in the lens direction (arrangement of the grooves 9 becomes coarse to dense from the center of the middle layer). That is, the spacing P2 between B-C is narrower than the spacing P1 between A-B.

EXAMPLE 2

Moreover, the plurality of grooves 9 are shaped such that they become wider from the center to the lens directional end of the middle layer. That is, the width W2 of the groove 9 between B-C is wider than the width W1 of the groove 9 between A-B (W1<W2). Here, width refers to the lens-wise length.

EXAMPLE 3

Moreover, the depths of the plurality of grooves 9 are shaped such that they become deeper from the center to the end of the middle layer. That is, the depth D2 of the grooves 9 between B-C is deeper than the depth D1 of the grooves 9 between A-B (D1<D2). Here, depth refers to the length orthogonally intersecting the lens direction and the array direction, respectively.

EXAMPLE 4

Moreover, the plurality of grooves 9 are shaped by any combination of two or more among Examples 1 to 3.

[Manufacturing Method of the Ultrasonic Probe]

The grooves 9 are shaped such that they do not penetrate the middle layer 8. The face shaping the grooves 9 in the middle layer 8 and the rear surface of the piezoelectric vibrator 3 are layered. Furthermore, the FPC2 and rear material 1 are connected to the rear surface of the middle layer 8. A glued connection using an epoxy resin, etc. is a general example of this connection. As a result, the epoxy resin is filled between the grooves 9 in the middle layer 8. The independently grooved middle layer 8 is subsequently connected with the FPC2, making processing easy. Moreover, the epoxy resin is filled inside the grooves 9, so the strength of the adhesive bonding of the middle layer 8 improves due to the anchoring effect of the grooves 9.

Subsequently, the acoustic matching layers (the first acoustic matching layer 4, the second acoustic matching layer 5, and the third acoustic matching layer 6) are layered on the acoustic emission side of the piezoelectric vibrator 3. Regarding this layered configuration, the ultrasonic probe is completed by element-arraying by dicing from the acoustic matching layer side and subsequently connecting the acoustic lens 7.

[Outcome of Acoustic Simulation]

Next, the outcome of the acoustic simulation of the ultrasonic probe related to Embodiment 1 is described with reference to FIG. 3. FIG. 3 is a diagram showing the outcome of acoustic simulation of the ultrasonic probe (maximum transmitted sound pressure).

Figure 3:
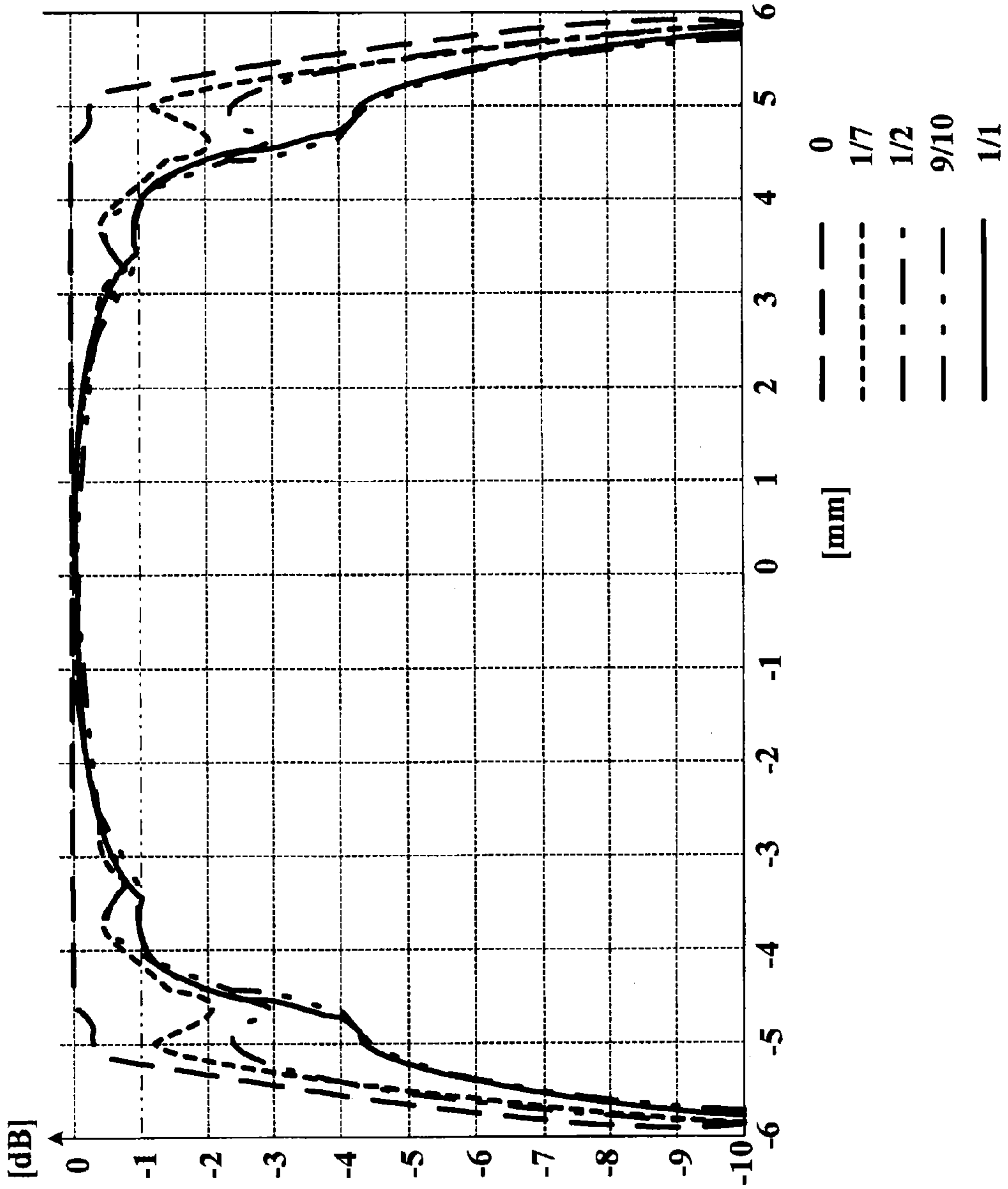
FIG. 3 is a diagram showing the outcome of acoustic simulation of the ultrasonic probe (maximum transmitted sound pressure).

As shown FIG. 3, the piezoelectric vibrator 3 was oscillated with impulse waveforms, and the maximum transmitted acoustic pressure in the third acoustic layer with water as the medium was plotted. The effect of the groove 9 depth reaching mid-way of the middle layer 8 thickness was confirmed. The groove 9 is shaped as shown in Example 1 described above. As illustrated in FIG. 1, the grooves 9 have the same depth. FIG. 3 illustrates the transmitted acoustic pressure plotted while the uniform depth of the grooves is changed all together to check the effect of the configuration of the above Example 1 and also the influence of the depth of the grooves 9 to the effect.

FIG. 3 shows decibels [dB] along the vertical axis while showing the location [mm] from the center to the end in the lens direction along the horizontal axis. For example, the central location is shown with 0 [mm] and the end locations are shown with 6 [mm], −6 [mm]. Moreover, the groove 9 depth for the middle layer 8 thickness is shown with “0”, “1/7”, “1/2”, and “9/10”.

As shown in FIG. 3, compared to when the grooves 9 are not shaped, that is, when the groove 9 depth with respect to the middle layer 8 thickness is 0, the sensitivity at the edge (5 [mm], −5 [mm]) of the lens direction declines with respect to the center (0 [mm]) as the grooves 9 becomes deeper, as in “1/7” to “9/10”, and it may be understood that the weighting effect of the transmission sensitivity is enhanced.

Embodiment 2

Next, the configuration and manufacturing method of the ultrasonic probe related to Embodiment 2 is described with reference to FIG. 3 and FIG. 4. FIG. 4 is a cross-sectional diagram related to Embodiment 2 with the ultrasonic probe cut in the lens direction. In this case, the designated grooves 9 are shaped from the middle layer 8 after connecting the piezoelectric vibrator 3 and the middle layer 8 in advance, or the designated grooves 9 are shaped from the middle layer 8 after connecting the FPC2 and the middle layer 8 in advance. The subsequent manufacturing process is the same as Embodiment 1.

The fundamental configuration of the ultrasonic probe is the same as Embodiment 1, and the arrangement of the grooves 9 in the lens direction is explained by the configuration of Example 1 in Embodiment 1. In Embodiment 1 (configuration of Example 1), the grooves 9 of the middle layer 8 were shaped such that they do not penetrate from the piezoelectric vibrator 3 side with respect to the middle layer 8 thickness (see FIG. 1); however, here, a case is described in which they do penetrate, as illustrated in FIG. 4. In such cases, the grooves 9 are shaped from the middle layer 8 side so as to penetrate as illustrated in FIG. 4, after connecting the piezoelectric vibrator 3 and the middle layer 8 in advance, or the grooves 9 are shaped from the middle layer 8 side so as to penetrate after connecting the FPC2 and the middle layer 8 in advance. The subsequent manufacturing process is the same as in Embodiment 1.

[Outcome of Acoustic Simulation]

Next, the outcome of acoustic simulation of the ultrasonic probe according to Embodiment 2 is described with reference to FIG. 3.

In FIG. 3, the depth of the groove 9 with respect to the thickness of the middle layer 8 is indicated as “1/1”. The effect of the grooves 9 shaped so as to penetrate with respect to the middle layer 8 thickness was confirmed. As shown in FIG. 3, the sensitivity at the lens direction ends (5 [mm], −5 [mm]) declines with respect to the center (0 [mm]), and it may be observed that the effect from weighting the transmission sensitivity is enhanced.

Embodiment 3

Next, the configuration and manufacturing method of the ultrasonic probe related to Embodiment 3 is described with reference to FIG. 5 and FIG. 6. FIG. 5 is a cross-sectional diagram with the ultrasonic probe cut in the lens direction.

The fundamental configuration of the ultrasonic probe related to Embodiment 3 is the same as in Embodiment 1, and the arrangement of the grooves 9 in the lens direction is explained by the configuration of Example 1 in Embodiment 1 as illustrated in FIG. 5. The grooves 9 were only shaped in the middle layer 8 in Embodiments 1 and 2; however, here, the grooves 9 are also shaped to penetrate the middle layer to reach the inside of the piezoelectric vibrator 3. In such cases, the grooves 9 are shaped to enter the piezoelectric vibrator 3 from the middle layer 8 after connecting the piezoelectric vibrator 3 and the middle layer 8 in advance, as illustrated in FIG. 5. The subsequent manufacturing process is the same as in Embodiment 1.

[Outcome of acoustic simulation]

Next, the outcome of acoustic simulation of the ultrasonic probe according to Embodiment 3 is described with reference to FIG. 6. FIG. 6 is a diagram showing the outcome of the acoustic simulation of the ultrasonic probe (maximum transmitted sound pressure). FIG. 6 illustrates the transmitted acoustic pressure plotted while the uniform depth of the grooves is changed all together to check the effect of the configuration of the above Example 1 and also the influence of the depth of the grooves 9 to the effect.

Figure 6:
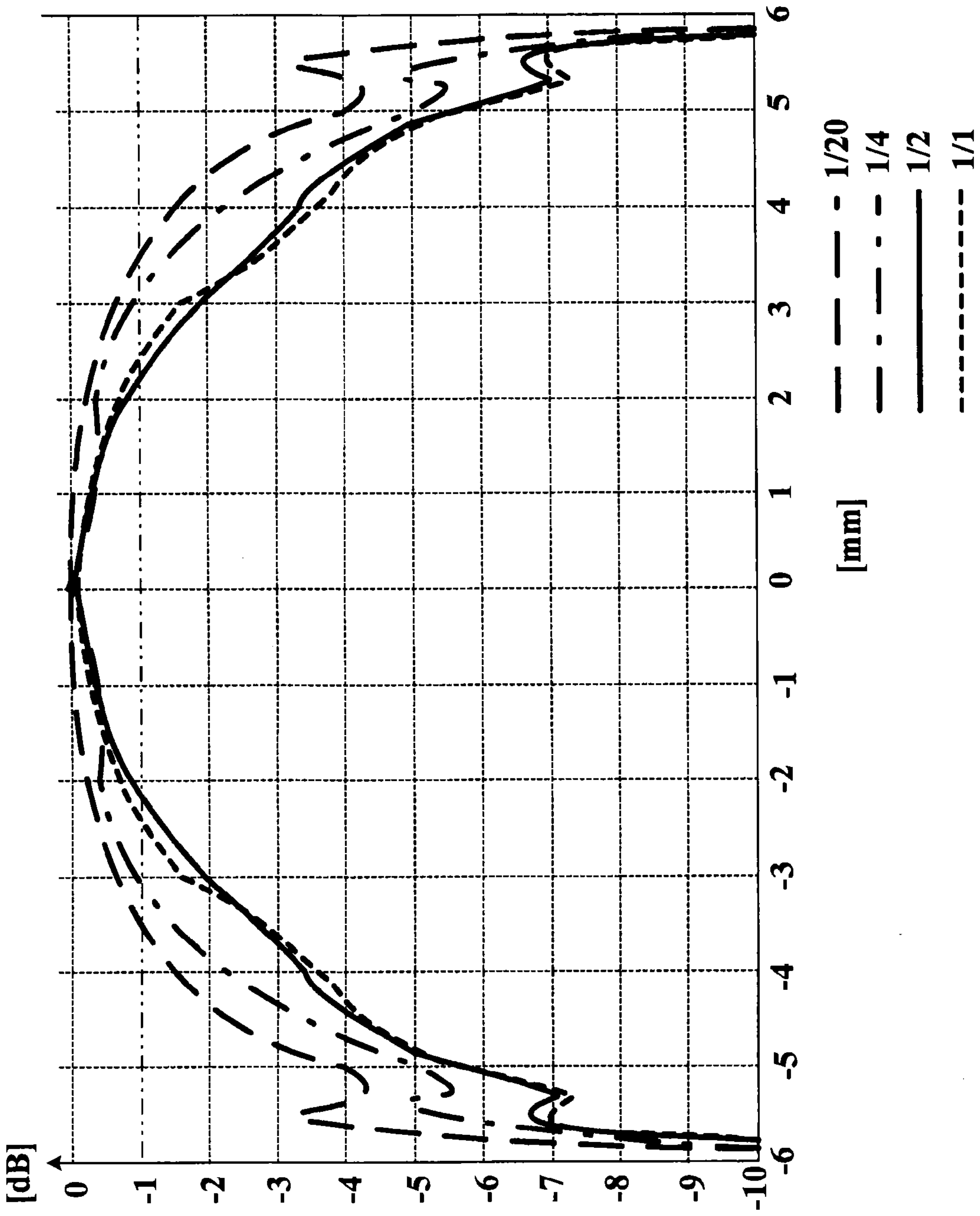
FIG. 6 is a diagram showing the outcome of acoustic simulation of the ultrasonic probe (maximum transmitted sound pressure).

FIG. 6 shows decibels [dB] along the vertical axis and shows the location from the center to the end in the lens direction along the horizontal axis. For example, the central location in shown with 0 and the end locations are shown with 6 [mm], −6 [mm]. Moreover, the groove 9 depth in the piezoelectric vibrator 3 with respect to the piezoelectric vibrator 3 thickness is shown with "1/20", "1/4", "1/2", and "1/1".

As shown in FIG. 6, when the grooves 9 are shaped in the piezoelectric vibrator 3 in addition to the middle layer 8, sensitivity at the lens direction ends (5 [mm], −5 [mm]) declines with respect to the center (0 [mm]), and it may be observed that the effect from weighting the transmission sensitivity is enhanced.

COMPARATIVE EXAMPLE

Figure 7:
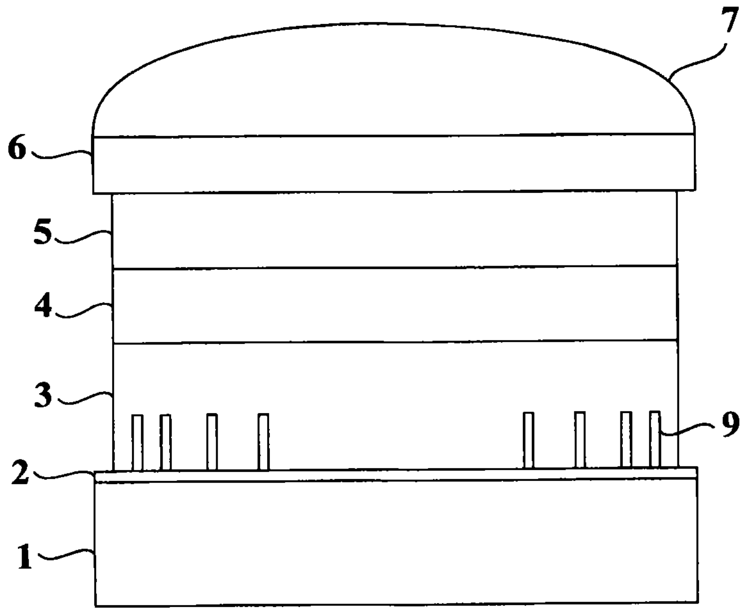
FIG. 7 is a cross-sectional diagram with the ultrasonic probe of the comparative example cut in the lens direction.

Next, configuration of the ultrasonic probe related to a comparative example is described with reference to FIG. 7. FIG. 7 is a cross-sectional diagram with the ultrasonic probe as the comparative example cut in the lens direction.

As shown in FIG. 7, the difference in the configuration of the comparative example with the embodiments is that the comparative example does not comprise the middle layer 8 and the grooves 9 are only shaped in the piezoelectric vibrator 3. The grooves 9 in the piezoelectric vibrator 3 illustrated in FIG. 7 as the comparative example are formed deeper than those from the boundary between the piezoelectric vibrator 3 and the middle layer 8 illustrated in FIG. 5 (the depth of the grooves in only the piezoelectric vibrator 3).

In the same manner as the grooves 9 related to the embodiment, the grooves 9 shaped in the piezoelectric vibrator 3 are shaped such that the percentage of the groove 9 capacity to the piezoelectric vibrator 3 volume increases in the lens direction along the center to the end of the piezoelectric vibrator 3 by changing the width, depth, and spacing of the grooves 9. Thereby, weighting of the slice direction (lens direction) may be carried out with respect to the piezoelectric vibrator 3.

Furthermore, it was mentioned earlier that there are problems with the restrictions, etc., of grooving when grooves are shaped in a piezoelectric vibrator 3 that is brittle; however, here, it is determined that there are no restrictions, etc., in grooving and sufficient weighting is carried out in the piezoelectric vibrator 3 related to the comparative example.

[Outcome of Acoustic Simulation Related to the Comparative Example]

Figure 8:
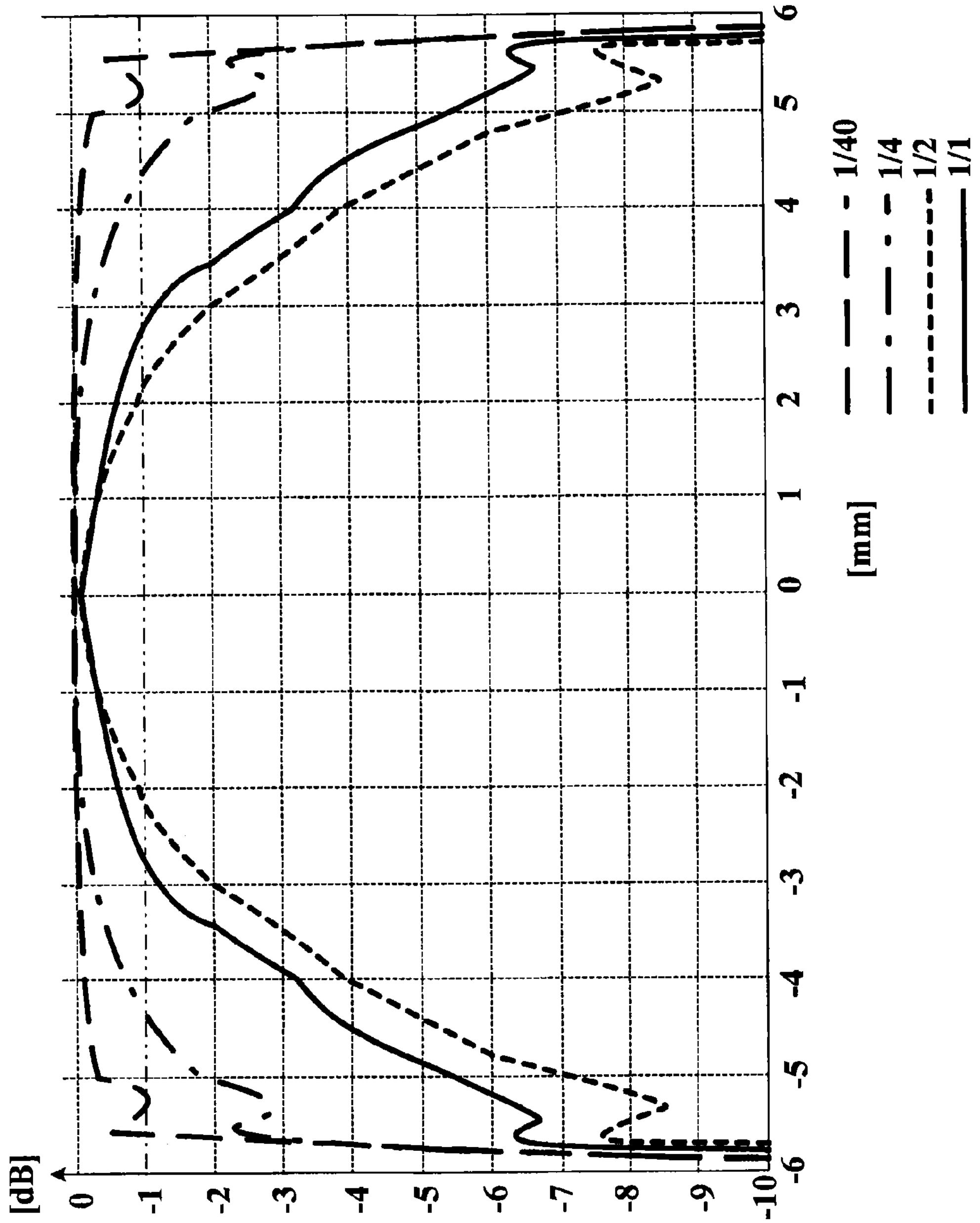
FIG. 8 is a diagram showing the outcome of acoustic simulation of the comparative example (maximum transmitted sound pressure).

FIG. 8 is a diagram showing the outcome of acoustic simulation of the ultrasonic probe related to the comparative example. The piezoelectric vibrator 3 was oscillated with impulse waveforms, and the maximum transmitted acoustic pressure in the third acoustic layer 6 with water as the medium was plotted. As the result of acoustic simulation, the effect due to the groove 9 depths was confirmed.

FIG. 8 shows decibels [dB] along the vertical axis and shows the location [mm] from the center to the end in the lens direction along the horizontal axis. For example, the central location is shown with 0 [mm] and the end location is shown with 6 [mm], −6 [mm]. Moreover, the groove 9 depth with respect to the piezoelectric vibrator 3 thickness is shown with "1/20", "1/4", "1/2", and "1/1".

As shown in FIG. 8 from "1/20" to "1/1", the sensitivity in the end declines with respect to the center as the grooves 9 become deeper, and it may be understood that weighting of the transmission sensitivity is being carried out.

[Comparison on the Outcome of Acoustic Simulation]

Next, a comparison of the outcome of acoustic simulation related to Embodiments 1 and 2 and the outcome of acoustic simulation related to the comparative example is described with reference to FIG. 3 and FIG. 8.

As shown in FIG. 3, if the groove 9 depth shaped in the piezoelectric vibrator 3 by the embodiment is, for example, "9/10" (Embodiment 1) and "1/1" (Embodiment 2), the transmission sensitivity at the ends (5 [mm], −5 [mm]) are respectively approximately −4.5 [dB]. Meanwhile, as shown in FIG. 8, when the groove 9 depth shaped in the piezoelectric vibrator 3 of the comparative example is, for example, "1/1", the transmission sensitivity at the ends (5 [mm], −5 [mm]) is approximately −5.5[dB], respectively.

From these results, in Embodiments 1 and 2, the same effect from weighting the transmission sensitivity as in the comparative example may be obtained by shaping the grooves 9 in the middle layer 8. There is no need to shape the grooves 9 in the piezoelectric vibrator 3, so the piezoelectric vibrator 3 is not damaged and reliability with respect to the piezoelectric vibrator 3 may be enhanced. Moreover, restrictions on workability with respect to the piezoelectric vibrator 3 may be relieved, while reducing the cost.

Next, a comparison of the outcome of the acoustic simulation according to Embodiment 3 and the outcome of the acoustic simulation according to the comparative example is described with reference to FIG. 6 and FIG. 8.

As shown in FIG. 6, if the groove 9 depth shaped in the piezoelectric vibrator 3 of Embodiment 3 is, for example, "1/20" and "1/4", the transmission sensitivity at the ends (5 [mm], −5 [mm]) are approximately −4 [dB] and approximately −5 [dB], respectively. Meanwhile, as shown in FIG. 8, when the groove 9 depth shaped in the piezoelectric vibrator 3 of the comparative example is, for example, "1/1", the transmission sensitivity at the ends (5 [mm], −5 [mm]) is approximately −5.5 [dB], respectively.

From these results, the groove 9 depth shaped in the piezoelectric vibrator 3 (FIG. 5 in Embodiment 3) may be shallower than the depth of the groove 9 shaped inside the piezoelectric vibrator 3 in the comparative example when obtaining the same transmission sensitivity weighting effect as the comparative ample, so the piezoelectric vibrator 3 is not damaged when the grooves 9 are processed and reliability with respect to the piezoelectric vibrator 3 may be enhanced. Moreover, restrictions on workability with respect to the piezoelectric vibrator 3 may be relieved, while reducing the cost.

As explained above, according to the configuration of the embodiment, weighting may be applied to the ultrasonic probe with low cost and high reliability.

Furthermore, according to the configuration of Embodiment 1 and Embodiment 2, grooving is carried out on the piezoelectric vibrator 3 with no damage to the piezoelectric vibrator 3; therefore, the reliability with respect to the piezoelectric vibrator 3 may be enhanced. Moreover, restrictions on grooving are improved, grooving in the middle layer 8 in the spacing smaller than grooving of the comparative example becomes possible, allowing sufficient weighting.

Furthermore, even when the groove 9 depth shaped in the piezoelectric vibrator 3 in the configuration of Embodiment 3 is shallower than the groove 9 depth shaped in the piezoelectric vibrator 3 of the comparative example, the same weighting effect as the comparative example may be obtained and the groove 9 may be kept shallow; thereby, damage to the piezoelectric vibrator 3 during grooving is prevented and reliability with respect to the piezoelectric vibrator 3 may be enhanced.

Moreover, in the embodiment, the depth of the shaped grooves 9 was fixed; however, this is not necessarily restricted to this, and for example, the groove 9 depth shaped in the middle and the end of the middle layer 8 may be different.

Moreover, in the embodiment, the transmission strength was described as the outcome of acoustic simulation; however, when the ultrasonic waves reflected in the subject are received by the ultrasonic probe, it is believed that the receiving sensitivity is weighted in the same manner as the transmission sensitivity.

Several embodiments of the present invention were explained; however, the embodiments were presented as examples, and are not intended to limit the range of the invention. The new embodiments may be carried out in other various forms, and various abbreviations, revisions, and changes may be carried out in a range not deviating from the gist of the invention. These embodiments and the deformations thereof are included in the range and gist of the invention and additionally included in the invention described in the patent claims and the equivalent thereof.

EXPLANATION OF SYMBOLS

1 Rear material
2 FPC
3 Piezoelectric vibrator
4 The first acoustic matching layer
5 The second acoustic matching layer
6 The third acoustic matching layer
7 Acoustic lens
8 Middle layer
9 Groove

What is claimed is:

1. An ultrasonic probe, comprising:

a piezoelectric vibrator that transmits and receives ultrasonic waves; and a layer connected to a rear surface of the piezoelectric vibrator, the rear surface of the piezoelectric vibrator being defined as being on a side opposite to a side of the piezoelectric vibrator receiving and sending the ultrasonic waves, the layer having a larger acoustic impedance than the piezoelectric vibrator, wherein the layer comprises a plurality of grooves arranged along a lens direction such that the rear surface of the piezoelectric vibrator faces a groove opening of each groove, and the plurality of grooves are shaped such that a ratio of a groove capacity to a layer volume increases in the lens direction away from a center of the rear surface of the piezoelectric vibrator.

2. The ultrasonic probe according to claim 1, wherein the layer has a Young's modulus larger than that of the piezoelectric vibrator.

3. The ultrasonic probe according to claim 1, wherein the plurality of grooves are shaped such that at least one of a spacing of the grooves becomes narrower, the grooves become wider, and the grooves become deeper in the lens direction away from a center of the rear surface of the piezoelectric vibrator.

4. The ultrasonic probe according to claim 1, wherein a depth of the grooves is smaller than the thickness of the layer.

5. The ultrasonic probe according to claim 1, wherein the grooves penetrate the layer.

6. The ultrasonic probe according to claim 1, wherein on the rear surface of the piezoelectric vibrator, in conformance with a location of the plurality of grooves on the layer, a plurality of grooves shallower than a depth corresponding to the piezoelectric vibrator depth are shaped.

7. The ultrasonic probe according to claim 1, wherein the grooves are filled with a resin material.

8. The ultrasonic probe according to claim 1, wherein the acoustic impedance of the layer is 30 [Mrayl] or more and/or the Young's modulus of the layer is 50 [GPa] or more.

9. The ultrasonic probe according to claim 1, wherein the layer comprises an electric conductor.

10. The ultrasonic probe according to claim 2, wherein a depth of the grooves is smaller than a thickness of the layer.

11. The ultrasonic probe according to claim 3, wherein a depth of the grooves is smaller than a thickness of the layer.

12. The ultrasonic probe according to claim 2, wherein the grooves penetrate the layer.

13. The ultrasonic probe according to claim 3, wherein the grooves penetrate the layer.

14. The ultrasonic probe according to claim 2, wherein on the rear surface of the piezoelectric vibrator, in conformance with a location of the plurality of grooves on the layer, a plurality of grooves shallower than a depth corresponding to the piezoelectric vibrator depth are shaped.

15. The ultrasonic probe according to claim 3, wherein on the rear surface of the piezoelectric vibrator, in conformance with a location of the plurality of grooves on the layer, a plurality of grooves shallower than a depth corresponding to the piezoelectric vibrator depth are shaped.

* * * * *